United States Patent
Takeuchi et al.

(10) Patent No.: US 7,488,693 B2
(45) Date of Patent: Feb. 10, 2009

(54) METHOD FOR PRODUCING SILICON OXIDE FILM

(75) Inventors: Hiroaki Takeuchi, Nagoya (JP); Satoshi Hattori, Nagoya (JP); Hiroshi Suzuki, Nagoya (JP); Katsuyoshi Harada, Nagoya (JP)

(73) Assignee: Toagosei Co., Ltd., Tokyo (JP)

( * ) Notice: Subject to any disclaimer, the term of this patent is extended or adjusted under 35 U.S.C. 154(b) by 45 days.

(21) Appl. No.: 10/589,077

(22) PCT Filed: Feb. 17, 2005

(86) PCT No.: PCT/JP2005/002425

§ 371 (c)(1),
(2), (4) Date: Mar. 9, 2007

(87) PCT Pub. No.: WO2005/078784

PCT Pub. Date: Aug. 25, 2005

(65) Prior Publication Data

US 2007/0173072 A1     Jul. 26, 2007

(30) Foreign Application Priority Data

Feb. 17, 2004    (JP)  .............................. 2004-040613

(51) Int. Cl.
*H01L 21/26*     (2006.01)
(52) U.S. Cl. ...................... 438/787; 438/778; 438/790
(58) Field of Classification Search ................ 438/778, 438/780, 781, 783, 784, 787–790
See application file for complete search history.

(56) References Cited

U.S. PATENT DOCUMENTS 5,173,452 A    12/1992    Mobuzinsky et al.
6,797,643 B2 *    9/2004    Rocha-Alvarez et al. .... 438/758
2007/0275569 A1 *    11/2007    Moghadam et al. ......... 438/781

FOREIGN PATENT DOCUMENTS

| JP | 2-263981 | 10/1990 |
|---|---|---|
| JP | 2 263981 | 10/1990 |
| JP | 7-142578 | 6/1995 |
| JP | 11-12542 | 1/1999 |
| JP | 11 12542 | 1/1999 |
| JP | 2003 297832 | 10/2003 |
| JP | 2003-297832 | 10/2003 |
| JP | 2003 342731 | 12/2003 |
| JP | 2003-342731 | 12/2003 |

* cited by examiner

*Primary Examiner*—Kevin M Picardat
(74) *Attorney, Agent, or Firm*—Oblon, Spivak, McClelland, Maier & Neustadt, P.C.

(57) ABSTRACT

[Problems] It is to provide a method for producing a silicon oxide film having better quality than a TEOS at low temperature. And it is to provide a method for manufacturing a semiconductor device wherein an insulating film composed of a silicon oxide is formed.

[Means for solving problems] A film composed of a silicon oxide is produced by CVD method where a silane compound represented by the following general formula is reacted. An insulating film is deposited by CVD method where a silane compound represented by the following general formula is reacted.

$$H_nSi_2(OR)_{6-n}$$

(In the above formula, R is an alkyl group of carbon number from 1 to 5, and n is an integer from 0 to 2.)

19 Claims, 1 Drawing Sheet

METHOD FOR PRODUCING SILICON OXIDE FILM

TECHNICAL FIELD

The present invention provides an efficient method for producing a silicon oxide film widely applied for manufacturing a semiconductor device.

The present invention also relates to a method for manufacturing a semiconductor device where an insulating film composed of a silicon oxide film is formed by CVD method.

BACKGROUND ART

Recently, miniaturization of a wiring in semiconductor devices has been advanced and the unevenness of a base substrate has become increasingly complex due to an increased aspect ratio and the like. Therefore, when an insulating film composed of a silicon oxide film or the like is formed on a substrate, for example on an semiconductor element, a forming method having good step coverage, being excellent in planarity and not adversely affecting the characteristics of the substrate is desired.

Conventionally, a method for forming a film by a thermochemical evaporation method using starting gases including a monosilane gas and oxygen as a producing method of a silicon oxide film is known. However the step coverage is not good so that a method by use of an organic-based silane gas such as tetraethoxysilane and ozone as starting materials has been examined.

Though the step coverage is good and the planarity is excellent in the case tetraethoxysilane is used as a starting material, it is necessary to set the deposition temperature usually to 400° C. or higher.

The silicon oxide film is manufactured by thermochemical vapor-phase deposition method, photochemical vapor-phase deposition method, plasma chemical vapor-phase deposition method and the like. However, there are problems in efficiency of manufacturing, that is, since high temperature is required to decompose or react a starting material by a heat in the thermochemical vapor-phase deposition method, however, and base materials on which a film is deposited are limited, and in the photochemical vapor-phase deposition method, while a film can be formed at low temperature, the window through which light is introduced is clouded and the deposition rate is low, being unfavorable.

In the plasma chemical vapor-phase deposition method, various methods for the silicone oxide film using a monosilane and an oxidizing agent such as oxygen and dinitrogen oxide as starting gases are examined. However, monosilane is hazardous and expensive, the use thereof is not industrially profitable, and the deposition temperature is high, therefore it is difficult to apply extensively in the methods.

A silane compound such as monosilane compound and disilane compound is used in various applications. In the field of a semiconductor, the silane compound is often used as a starting material to manufacture a silicon-based insulating film composed of silicon nitride, silicon oxide, silicon oxynitride by CVD method. That is, in the case a silane compound is used, a reaction with a nitrogen-containing reactable gas such as ammonia leads to a silicon nitride, a reaction with an oxygen-containing gas such as oxygen to a silicon oxide, and a reaction with a nitrogen-containing gas and an oxygen-containing gas to a silicon oxynitride.

There is a reaction where $SiH_4$ gaseous starting material as a silane compound is oxidized with $O_2$ for the standard production method of a silicon oxide by CVD method. Regarding the minimum design dimension of the semiconductor device, a thickness of the silicon oxide film has reached the stage as being counted by the number of layers of atoms accompanying high integration of an LSI in recent years. And it is required to lower the temperature of the process in order to reduce the problems of a heat-loading considering the miniaturization of an element structure.

Conventional CVD process using $SiH_4$ gaseous starting material cannot flatten an uneven surface and a corrugated surface on the substrate. In addition, this CVD process, a void is formed in a space between narrow electrodes or in a trench of a gate to deteriorate significantly the film characteristics. Moreover $SiH_4$ is an extremely dangerous starting material due to its self-ignitability.

In order to overcome the above failures, a reaction where tetraethoxysilane (hereinafter referred to as TEOS) as a liquid starting material instead of $SiH_4$ is used and an oxidation with $O_3$ is performed, is applied and has been made practical.

However, a film to be deposited by CVD method using TEOS still has problems in film quality such as minuteness, crack resistance and insulation properties. The substrate is required to be heated at 600 to 700° C. for forming a film while solving this problem. Accordingly, when a $SiO_2$ film was formed on an aluminum wiring by CVD method using TEOS, there was a failure of deteriorating the aluminum wiring.

Moreover, a method for forming a silicon oxide film by reacting alkoxysilane and oxygen in a low-pressure vapor-phase deposition method is also known. In this case it is possible to form thin films even at low temperature and form thin films even on a glass substrate and on a polymeric film having poor heat resistance, being advantageous, however, the deposition temperature supposed to be suitable in this method is about 350° C. to 400° C. at the lowest, and the formed silicon oxide film is not necessarily satisfactory enough in planarity and film quality.

As a technique for improving film quality and embedding of an insulating film, a method for forming a silicon oxide film on a semiconductor substrate by CVD method where an organic alkoxysilane comprising one or more of straight-chain siloxane bond and ozone are reacted, is known. (For example, Patent document 1)

[Patent Document 1] JP-A H7-142578

DISCLOSURE OF THE INVENTION

[Problems to be Solved by the Invention]

The present subject by the inventors is to provide a method for producing a silicon oxide film wherein a sufficient deposition rate at low temperature is obtained, film quality is uniform, step coverage is good, planarity is excellent and low-cost and safety is assured.

In addition, the present invention provides a manufacturing method of a semiconductor device where an $SiO_2$ insulating film having better film quality superior to one by TEOS is formed at low temperature.

[Means for Solving Problems]

The present invention is a method for producing a silicon oxide film, which is characterized in that the silicon oxide film is formed by thermochemical vapor-phase deposition method or plasma chemical vapor-phase deposition method at the pressure in the range from 0.01 mmHg to 2 atm using a silane compound and a diluted gas as a starting gas.

$$H_nSi_2(OR)_{6-n}$$

(In the above formula, R is an alkyl group of carbon number from 1 to 6, and n is an integer from 0 to 5.)

[Effects of the Invention]

According to the present invention, since a silicon oxide film can be produced at high deposition rate and at low temperature, the film can be widely used as a base material such as a base substrate to be treated at low temperature. Additionally, the obtained film is uniform, excellent in planarity, and good in step coverage.

Moreover, according to the present invention, an insulating film in a semiconductor device can be obtained at lower deposition temperature.

BEST MODE FOR CARRYING OUT THE INVENTION

Figure 1:
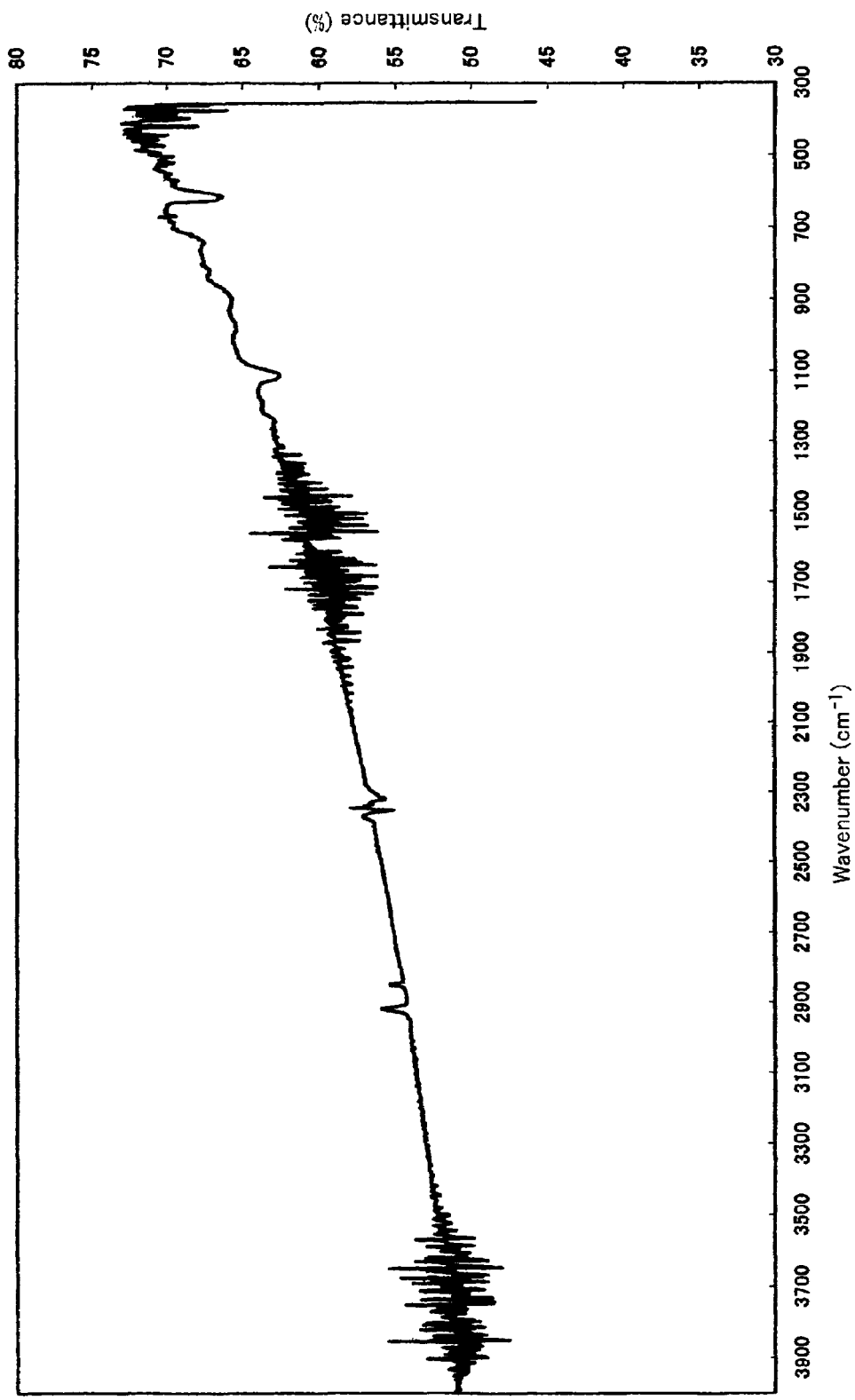
FIG. 1 is an infrared absorbing spectrum of the film obtained in Example 7.

In the present invention, an alkoxydisilane as a starting material is a compound represented by the following formula.

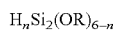

$H_nSi_2(OR)_{6-n}$ (In the above formula, R is an alkyl group of carbon number from 1 to 6, and n is an integer from 0 to 5.)

Specified examples include monoalkoxydisilane, dialkoxydisilane, trialkoxydisilane, tetraalkoxydisilane, pentaalkoxydisilane, hexaalkoxydisilane and the like. The preferable compound is one where n in the above formula is 2 and less. Examples of the preferable disilane compound include tetraethoxysilane and hexaalkoxysilane, and particularly preferable compound is hexaalkoxysilane. In addition, the alkoxydisilane has preferably an alkoxy group having carbon number from 1 to 6, and an ethoxy group is particularly preferable.

The specific example of the alkxysilane includes a monoalkoxydisilane such as monomethoxydisilane, monoethoxydisilane, monopropoxydisilane and monobutoxydisilane; a dialkoxydisilane such as dimethoxydisilane, diethoxydislane, propoxydisilane and dibutoxydisilane; a trialkoxydisilane such as trimethoxydisilane, triethoxydisilane, tripropoxydisilane and tributoxydisilane; a tetraalkoxydisilane such as tetramethoxydisilane, tetraethoxydisilane, tetrapropoxydisilane and tetrabutoxydisilane; a pentaalkoxydisilane such as pentamethoxydisilane, pentaethoxydisilane, pentapropoxydisilane and pentabutoxydisilane; a hexaalkoxydisilane such as hexamethoxydisilane, hexaethoxydisilane, hexapropoxydisilane and hexabutoxydisilane. Among these, tetraethoxydisilane and hexaethoxydisilane are more preferable. The most preferable is hexaethoxydisilane.

When hexaethoxydisilane is used, a silicon oxide film having excellent electrical characteristics can be obtained.

The commonly-used method for supplying alkoxydisilane to the reaction system is to supply the alkoxydisilane after vaporizing by bubbling with a diluted gas or to supply the alkoxydisilane with the diluted gas after vaporizing the alkoxysilane by heating.

The diluted gas that is used to supply the alkoxydisilane and is to be present in the reaction system includes a rare gas such as helium, neon, argon, krypton and xenon, nitrogen, hydrogen and the like. More preferable diluted gas is a rare gas or nitrogen.

The amount of the diluted gas based on an amount of all gases comprising a starting gas in the reaction system is preferably 50 vol % or more, particularly in the range from 80 vol % to 99 vol %. If the amount is less than 50 vol %, plasma might not be activated stably and the film quality thereby might become poor.

The pressure in the reaction system is required to be in the range from 0.01 mmHg to 2 atm. If the pressure is less than 0.01 mmHg, an ultra-high vacuum evacuation system is required. On the other hand, if it is exceeding 2 atm, problems of safety and high-cost occur. The preferable pressure is from 0.01 mmHg to 800 mmHg and further preferable pressure is from 0.1 mmHg to 800 mmHg.

Presence of an oxidizing agent in the reaction system leads to a minute film by production at lower temperature. The oxidizing agent includes air, oxygen, ozone, $N_2O$, $NO$, $NO_2$, $CO_2$, $CO$ and the like.

The amount of the oxidizing agent to be used is preferably in the range from 0.5 mole to 50 moles based on 1 mole of alkoxydisilane. If the amount is less than 0.5 mole, a minute film sometimes cannot be obtained. On the other hand, if the amount is exceeding 50 mole, a fine particle composed of silicon oxide is easily produced by gas phase reaction, and not only the film quality is deteriorated but also an efficiency from a starting material to a film is reduced, being not economical.

The general method for introducing the oxidizing agent into a reaction system is to use the agent with a starting gas, however, they may be introduced into the system separately.

The substrate of which a silicon film is formed on its surface in the present invention includes, for example, a substrate for a semiconductor, a semiconductor element such as metal interconnection, and the like. The suitable material of the substrate is not only silicon, glass, aluminum, stainless steel or the like, but also an amorphous material such as amorphous silicon, and a plastic such as polyester, polyimide and glass epoxy because the deposition at low temperature is possible in the present invention. In addition, the shape of the substrate is not particularly limited.

The deposition temperature for a silicon oxide film onto the substrate is sufficient at low temperature in the range from 200° C. to 500° C. If the temperature is less than 200, the film quality is sometimes deteriorated. The specific deposition temperature may be selected according to a starting gas. In the case of using hexaethoxydisilane, the temperature ranging from 200° C. to 300° C. is more preferable.

The reaction apparatus used in the present invention is not particularly limited. For example, vertical type, horizontal type, pancake type, belt conveyer type, take-up type and the like can be used.

When the plasma chemical vapor-phase deposition method is performed, the reaction apparatus is not particularly limited so long as an electrode to which high voltage is applied and a ground electrode are arranged in a reactor vessel, and deposition is capable at the pressure in the range from 0.01 mmHg to 2 atm. Moreover, in case the substrate is composed of a metal or the like, it is sometimes hard to form a silicon oxide film by plasma-enhancement using an alkoxydisilane because of a generation of an arc discharge by applying high voltage around the atmospheric pressure. In order to be applicable even to such a case, it is preferable to use an electrode device in which a heat-resistant solid dielectric composed of a glass, a ceramic, a plastic or the like is arranged on the electrode to which high voltage is applied.

The oscillating frequency may be properly selected in the range from low frequency of 50 Hz to 60 Hz to high frequency of 13.56 MHz, 27 MHz or 2.45 GHz or more.

The preferable silane compound represented by the above formula includes hexaethoxydisilane.

Hexaethoxydisilane has a structure where 6 ethoxy groups are attached to 2 silicon atoms and is transparent and colorless liquid at room temperature.

The heating temperature of the substrate by CVD method is normally in the range from 300 to 500° C.

The present invention can be applied to the manufacturing of a semiconductor element for liquid crystal that is formed on a glass substrate, and a good silicon oxide film can be formed at low temperature.

The silicon oxide film formed by the present invention is used as an interlayer insulating film, a protective film, a mask material, a gas barrier film and the like.

EXAMPLES

Example 1

A $SiO_2$ film was formed by a normal-pressure ozone CVD method using hexaethoxydisilane. The conditions for film formation were: at a flow rate of 6 sccm with hexaethoxydisilane, at a flow rate of 2 slm with $O_2$ containing ozone at a concentration of 4.5%, at a flow rate of 0.5 slm with $N_2$ as dilution gas and at a substrate temperature of 300° C.

The pressure in the reaction apparatus was set to 760 mmHg to react for 10 minutes to form a film having a thickness of 0.22 μm.

At this time where the field intensity was 7 $MVcm^{-1}$, the leak current became $10^{-8}$ $A \cdot cm^{-2}$ or less and the dielectric strength voltage was 10 $MVcm^{-1}$. The silicon oxide film had a film quality equal to a silicon oxide film formed at a dielectric strength voltage from 8 to 11 $MVcm^{-1}$ when film-forming at about 1100° C. in a high-temperature thermal oxidation method in which the best film quality is obtained.

Comparative Example 1

A film having a thickness of 0.10 μm was formed in the same manner as Example 1 except that TEOS was used instead of hexaethoxydisilane.

Evaluating in the same manner as Example 1, the leak current was $3 \times 10^{-6}$ $A \cdot cm^{-2}$.

Example 2

A cylindrical reactor vessel (200 mmø×100 mmH) made of quartz was used in a reaction apparatus. A silicon substrate (3 in.ø) was put on a suscepter in the reaction apparatus, and the substrate was heated and kept at 400° C.

Hexaethoxydisilane that was heated to 80° C. was subjected to bubbling with helium at flow rate of 100 ml/min. (equal to supply as hexaethoxydisilane at 0.27 ml/min.) and was introduced with helium at 2000 ml/min. and oxygen at 10 ml/min. into the above apparatus.

The pressure in the reaction apparatus was set to 760 mmHg to react for 10 minutes to form a film having a thickness of 0.12 μm.

The obtained film was uniform and excellent in planarity. After an examination of the infrared absorbing spectrum, it was proved that the film was a silicon oxide film and that an organic component having ethoxy group, ethyl group or the like had not remained.

Comparative Example 2

An experiment was conducted in the same manner as Example 2 except that monosilane is used as a starting gas and that 10 ml/min. of monosilane was introduced with helium at 2000 ml/min. and oxygen at 100 ml/min. into the apparatus. As a result, a generation of fine particles was observed in the reaction apparatus and there were a rough part and an uneven part on the surface of the formed film.

Example 3

The reaction apparatus in Example 2 was used. A silicon substrate (3 in.ø) was put on a suscepter, and the substrate was heated and kept at 400° C.

The starting gas, helium and oxygen was introduced into the reaction apparatus in the same manner as Example 2 except that hexaethoxydisilane heated to 80° C. was subjected to bubbling with helium at flow rate of 100 ml/min. (equal to supply as hexaethoxydisilane at 0.27 ml/min.).

After that, the pressure in the reaction apparatus was set to 10 mmHg to react for 10 minutes to form a film having a thickness of 0.06 μm.

The obtained film was uniform and excellent in planarity. After an examination of the infrared absorbing spectrum, it was proved that the film was a silicon oxide film and that an organic component having ethoxy group, ethyl group or the like had not remained.

Comparative Example 3

An experiment was conducted in the same manner as Example 3 except that monosilane is used as a starting gas and that 10 ml/min. of monosilane was introduced with helium at 2000 ml/min. and oxygen at 100 ml/min. into the apparatus. As a result, a generation of fine particles was observed in the reaction apparatus and a film was not formed.

Example 4

A cylindrical reactor vessel (200 mmø×100 mmH) made of stainless, having parallel plate electrodes of stainless was used in a reaction apparatus, and the distance between the upper electrode (100 mmø) and the lower electrode (100 mmø) was set to 10 mm. A silicon substrate (3 in.ø) was put on a suscepter in the reaction apparatus, and the substrate was heated and kept at 250° C.

Hexaethoxydisilane that was heated to 80° C. was subjected to bubbling with helium at flow rate of 100 ml/min. (equal to supply as hexaethoxydisilane at 0.27 ml/min.) and was introduced with helium at 2000 ml/min. and oxygen at 10 ml/min. into the above apparatus.

The pressure in the reaction apparatus was set to 0.1 mmHg and a glow discharge was generated at a high frequency of 13.56 MHz and a power of 50 W to be a plasma state. After that, a reaction for 10 minutes was formed a film having a thickness of 0.2 μm.

The obtained film was uniform and excellent in planarity. After an examination of the infrared absorbing spectrum, it was proved that the film was a silicon oxide film and that an organic component having ethoxy group, ethyl group or the like had not remained.

Example 5

A cylindrical reactor vessel (200 mmø×100 mmH) made of quartz, having parallel plate electrodes of aluminum was used in a reaction apparatus. The upper electrode (100 mmø) where quartz as a dielectric is disposed on its surface was used for a high voltage electrode and the lower electrode (100 mmø) was used for a ground electrode. And the distance between the electrodes was set to 10 mm. A silicon substrate (3 in.ø) was put on a susceptor in the reaction apparatus, and the substrate was heated and kept at 250° C.

Hexaethoxydisilane that was heated to 80° C. was subjected to bubbling with helium at flow rate of 100 ml/min. (equal to supply as hexaethoxydisilane at 0.27 ml/min.) and was introduced with helium at 2000 ml/min. and oxygen at 100 ml/min. into the above apparatus.

The pressure in the reaction apparatus was set to 800 mmHg and a glow discharge was generated at a high frequency of 13.56 MHz and a power of 50 W to be a plasma state. After that, a reaction for 1 minute was formed a film having a thickness of 0.02 μm.

The obtained film was uniform and excellent in planarity. After an examination of the infrared absorbing spectrum, it was proved that the film was a silicon oxide film and that an organic component having ethoxy group, ethyl group or the like had not remained.

Comparative Example 4

An experiment was conducted in the same manner as Example 4 except that monosilane is used as a starting gas and that 10 ml/min. of monosilane was introduced with helium at 2000 ml/min. and oxygen at 100 ml/min. into the apparatus. As a result, a generation of fine particles was observed in the reaction apparatus and there were a rough part and an uneven part on the surface of the formed film.

Example 6

The reaction apparatus in Example 5 was used. A film (50 mm square) of polythyleneterephtharate was put on a suscepter, and was heated and kept at 70° C.

The starting gas, helium and oxygen was introduced into the reaction apparatus in the same manner as Example 5 except that hexaethoxydisilane heated to 80° C. was subjected to bubbling with helium at flow rate of 100 ml/min. (equal to supply as hexaethoxydisilane at 0.27 ml/min.).

The pressure in the reaction apparatus, the high frequency and the power were set to those in the same as Example 5 and discharging for 1 minute was performed to form a film having a thickness of 0.02 μm.

The obtained film was uniform and excellent in planarity. After an examination of the infrared absorbing spectrum, it was proved that the film was a silicon oxide film and that an organic component having ethoxy group, ethyl group or the like had not remained.

Comparative Example 5

An experiment was conducted in the same manner as Example 5 except that monosilane is used as a starting gas and that 10 ml/min. of monosilane was introduced with helium at 2000 ml/min. and oxygen at 100 ml/min. into the apparatus. As a result, a generation of fine particles was observed in the reaction apparatus and a film was not formed.

Example 7

A cylindrical reactor vessel (30 mmø×600 mmH) made of quartz was used in a reaction apparatus. A silicon substrate (10 mm×10 mm) was put on a suscepter in the reaction apparatus, and the substrate was heated and kept at 400° C.

Hexaethoxydisilane that was heated to 70° C. was subjected to bubbling with nitrogen at flow rate of 50 ml/min. and was introduced with oxygen at 3000 ml/min. into the above apparatus.

The pressure in the reaction apparatus was set to 760 mmHg to react for 240 minutes to form a film having a thickness of 0.12 μm.

The infrared absorbing spectrum regarding the obtained film was shown in FIG. 1.

The absorption of Si—O unique to $SiO_2$ was observed at around 1100 $cm^{-1}$ and it was found that a silicon oxide film was formed.

Example 8

A cylindrical reactor vessel (30 mmø×600 mmH) made of quartz was used in a reaction apparatus. A silicon substrate (10 mm×10 mm) was put on a suscepter in the reaction apparatus, and the substrate was heated and kept at 500° C.

Hexaethoxydisilane that was heated to 70° C. was subjected to bubbling with nitrogen at flow rate of 50 ml/min. and was introduced with oxygen at 3000 ml/min. into the above apparatus.

The pressure in the reaction apparatus was set to 760 mmHg to react for 240 minutes to form a film having a thickness of 0.15 μm.

INDUSTRIAL APPLICABILITY

The present invention is available for manufacturing a high-integration semiconductor device deteriorating performances if the wiring and the element are exposed to high temperature.

The invention claimed is:

1. A method for producing a silicon oxide film comprising forming a silicon oxide film by thermochemical vapor-phase deposition at a pressure of 0.01 mmHg to 2 atm using an alkoxydisilane compound of the formula $$H_n Si_2 (OR)_{6-n}$$

wherein

R is an alkyl group of carbon number from 1 to 6, and n is an integer from 0 to 5 and a diluting gas.

2. The method for producing a silicon oxide film according to claim 1, wherein said silicon oxide film is formed by plasma chemical vapor-phase deposition.

3. The method for producing a silicon oxide film according to claim 1, wherein ozone is used as an oxidizing agent.

4. The method for producing a silicon oxide film according to claim 1, wherein the deposition temperature is from 200 to 500° C.

5. A method for manufacturing a semiconductor device comprising depositing an insulating film comprising a silicon oxide film of claim 1.

6. The method for producing a silicon oxide film according to claim 1, wherein said alkoxydisilane is a monoalkoxydisilane.

7. The method for producing a silicon oxide film according to claim 6, wherein said monoalkoxydisilane is selected from the group consisting of monomethoxydisilane, monoethoxydisilane, monopropoxydisilane, and monobutoxydisilane.

8. The method for producing a silicon oxide film according to claim 1, wherein said alkoxydisilane is a dialkoxydisilane.

9. The method for producing a silicon oxide film according to claim 8, wherein said dialkoxydisilane is selected from the group consisting of dimethoxydisilane, diethoxydisilane, propoxydisilane, and dibutoxydisilane.

10. The method for producing a silicon oxide film according to claim 1, wherein said alkoxydisilane is a trialkoxydisilane.

11. The method for producing a silicon oxide film according to claim 10, wherein said trialkoxydisilane is selected from the group consisting of trimethoxydisilane, triethoxydisilane, tripropoxydisilane, and tributoxydisilane.

12. The method for producing a silicon oxide film according to claim 1, wherein said alkoxydisilane is a tetraalkoxydisilane.

13. The method for producing a silicon oxide film according to claim 12, wherein said tetraalkoxydisilane is selected from the group consisting of tetramethoxydisilane, tetraethoxydisilane, tetrapropoxydisilane, and tetrabutoxydisilane.

14. The method for producing a silicon oxide film according to claim 1, wherein said alkoxydisilane is a pentaalkoxydisilane.

15. The method for producing a silicon oxide film according to claim 14, wherein said pentaalkoxydisilane is selected from the group consisting of pentamethoxydisilane, pentaethoxydisilane, pentapropoxydisilane, and pentabutoxydisilane.

16. The method for producing a silicon oxide film according to claim 1, wherein said alkoxydisilane is a hexaalkoxydisilane.

17. The method for producing a silicon oxide film according to claim 16, wherein said hexaalkoxydisilane is selected from the group consisting of hexamethoxydisilane, hexaethoxydisilane, hexapropoxydisilane, and hexabutoxydisilane.

18. The method for producing a silicon oxide film according to claim 1, wherein said alkoxydisilane is tetraethoxydisilane.

19. The method for producing a silicon oxide film according to claim 1, wherein said alkoxydisilane is hexaethoxydisilane.

* * * * *